United States Patent
Reynes et al.

(10) Patent No.: US 8,592,894 B2
(45) Date of Patent: Nov. 26, 2013

(54) METHOD OF FORMING A POWER SEMICONDUCTOR DEVICE AND POWER SEMICONDUCTOR DEVICE

(75) Inventors: Jean Michel Reynes, Pompertuzat (FR); Evgueniy Stafanov, Vieille Toulouse (FR); Yann Weber, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 185 days.

(21) Appl. No.: 12/999,143

(22) PCT Filed: Jun. 30, 2008

(86) PCT No.: PCT/IB2008/053512
§ 371 (c)(1),
(2), (4) Date: Dec. 15, 2010

(87) PCT Pub. No.: WO2010/001201
PCT Pub. Date: Jan. 7, 2010

(65) Prior Publication Data
US 2011/0089483 A1    Apr. 21, 2011

(51) Int. Cl.
*H01L 29/78*    (2006.01)
*H01L 21/336*    (2006.01)

(52) U.S. Cl.
USPC ...... 257/329; 257/339; 257/368; 257/E29.26; 257/E21.135

(58) Field of Classification Search
USPC ............. 257/329, E21.409, E29.26, E21.135, 257/339, 368
See application file for complete search history.

(56) References Cited

U.S. PATENT DOCUMENTS 5,032,878 A    7/1991   Davies et al.
5,075,739 A   12/1991   Davies (Continued)

FOREIGN PATENT DOCUMENTS

| EP | 0436171 A | 7/1991 |
|---|---|---|
| WO | 03/107432 A1 | 12/2003 |
| WO | 2006/125330 A | 11/2006 |
| WO | 2008/084278 A1 | 7/2008 |

OTHER PUBLICATIONS

Mutsuhiro Mori et al: "A Planar-Gate High-Conductivity IGBT (HiGT) With Hole-Barrier Layer" Jun. 1, 2007, IEEE Transactions on Electron Devices, IEEE Service Center, Piscataway, NJ, US, pp. 1515-1520.

Clark Lowell E et al: "High-Voltage Termination Using Enhanced Surface Doping" Proceedings of 1992 International Symposium on Power Semiconductor Devices & ICs, Tokyo, pp. 86-90.

(Continued)

*Primary Examiner* — Cathy N Lam

(57) ABSTRACT

A method of forming a power semiconductor device comprises forming a first semiconductor layer of a first conductivity type extending across the power semiconductor device; forming an epitaxial layer of the first conductivity type over the first semiconductor layer, the epitaxial layer having a doping concentration that increases from a first surface of the epitaxial layer towards the first semiconductor layer; forming a body region of a second conductivity type in the epitaxial layer extending from the first surface of the epitaxial layer into the epitaxial layer, wherein a junction between the body region and the epitaxial layer is at or substantially adjacent to a region of the epitaxial layer having a maximum doping concentration; and forming a gate region such that the gate region is adjacent at least a portion of the body region. In operation of the semiconductor device, the portion of the body region adjacent the gate region functions as a channel region of the semiconductor device.

20 Claims, 8 Drawing Sheets

(56) References Cited

U.S. PATENT DOCUMENTS

| | | |
|---|---|---|
| 5,777,373 A | 7/1998 | Groenig |
| 6,809,349 B2 | 10/2004 | Yamaguchi et al. |
| 2005/0263853 A1 | 12/2005 | Tomomatsu et al. |
| 2007/0018179 A1* | 1/2007 | Kub et al. .................. 257/94 |
| 2007/0267663 A1 | 11/2007 | Harada |

OTHER PUBLICATIONS

International Search Report and Written Opinion correlating to PCT/IB2008/053512 dated Feb. 10, 2009.

* cited by examiner

METHOD OF FORMING A POWER SEMICONDUCTOR DEVICE AND POWER SEMICONDUCTOR DEVICE

FIELD OF THE INVENTION

This disclosure relates to power semiconductor devices and methods of forming a power semiconductor device. In particular, this disclosure relates to insulated gate power semiconductor devices.

BACKGROUND OF THE INVENTION

Power semiconductor devices such as Metal Oxide Semiconductor Field Effect Transistors (MOSFETs) and Insulated Gate Bipolar Transistors (IGBTs) are commonly used as power devices in applications, such as automotive electronics, power supplies, telecommunications, which applications require devices to operate at currents in the range of tens up to hundreds of amperes (A).

The IGBT combines the simple gate-drive characteristics of MOSFET devices with the high-current gain and low-saturation-voltage capability of bipolar transistors by combining an insulated-gate FET for the control input and a bipolar power transistor as a switch in a single device.

A typical simplified structure of a cell of a planar IGBT is shown in FIG. 1. As is well known, the active area of an IGBT device comprises a plurality of such cells. The IGBT cell comprises an anode electrode 2 electrically connected to a p+ type anode layer 4. A n type semiconductor layer 5 is formed over the p+ type anode layer 4. A n− type base semiconductor layer 6 is formed over the n type semiconductor layer 5 and p type body regions 8 are formed in the n− base semiconductor layer 6. N+ type emitter regions 10 are formed in the p type body regions 8 and a polysilicon layer region 12 acting as a gate electrode is formed over portions of the n− type base semiconductor layer 6, the p type body regions 8 and the n+ type emitter regions 10. A cathode electrode 14 is electrically shorted to the p type body regions 8 and the n+ type emitter regions 10. By applying a voltage to the gate electrode and so across the gate oxide dielectric layer 13, the IGBT device is turned on and a channel will be formed at the surface of the p type body regions 8, between the n+ emitter region 10 and the n− type base semiconductor layer 6, under the insulated gate electrode 12 connecting the n+ type emitter regions and the p+ type anode layer allowing a current to flow between the anode and the cathode electrodes.

Trench-gate IGBTs have also been developed in which the insulated gate electrodes are formed in trenches extending into the n− type base semiconductor layer and intersecting the n+ type emitter regions.

A disadvantage of IGBTs over a standard MOSFET transistor is the IGBTs slower turn-off time. Faster turn-off times can be achieved by certain changes in design or processes, but at the expense of higher saturated voltage drops between anode and cathode electrodes (Vcesat). Devices with higher Vcesat have smaller Safe Operating Areas (SOA) of operation which is generally not desirable.

Decreasing Vcesat also allows the on-state losses to be reduced, and the die size decreased, which enables the size of the full operating system to be reduced. Also, the thermal behaviour is enhanced by decreasing Vcesat. Usually, Vcesat can be improved by increasing the MOSFET transconductance (which is the upper part of the IGBT device). Unfortunately, during a short-circuit event, there is nothing to limit the amount of current (Icsat) passing through the device, except reducing its transconductance which in turn will degrade the Vcesat.

In order to improve performance of IGBTs, methods have been developed to reduce Vcesat. However, as Vcesat is reduced, the current in the anode electrode at saturation Icsat is increased. This reduces the short circuit capability of the device. Thus, there is a trade-off between Vcesat and Icsat which needs to be accounted for when attempting to reduce Vcesat.

An article entitled 'A Planar-Gate High-Conductivity IGBT (HiGT) With Hole-Barrier Layer' by Mutsuhiro Mori, Kazuhiro Oyama, Taiga Arai, Junichi Sakano, Yoshitaka Nishimura, Koutarou Masuda, Katsuaki Saito, Yoshihiro Uchino and Hideo Homma, in IEEE Transactions on Electron Devices, Vol. 54, No. 6, June 2007, ages 1515 to 1520 describes a planar IGBT with a double diffused MOS structure and a n type hole barrier layer surrounding a p type base region. The hole barrier layer prevents the holes from flowing into the p type base region and stores them in the n type hole barrier layer. The planar structure having the hole barrier layer described in this article reduces Vcesat, regardless of the injection efficiency of the p type anode layer, while it maintains a high breakdown voltage by controlling the sheet carrier concentration of the hole barrier layer and maintains Icsat at a level that is similar to that of conventional IGBTs. The hole barrier layer is formed around the p type base region by implantation. However, the diffusivity of n type dopants is very low compared to p type dopants so manufacturing the structure described in this article in practice would be difficult to achieve, particularly since it would be hard to autoalign the n type hole barrier layer and the p type base region. In addition, a special mask must be used to form the hole barrier layer, which mask has to be autoaligned with the base region in order to prevent detrimental breakdown voltage and threshold voltage variations. Thus, the method disclosed in this article requires additional critical manufacturing steps which add to the cost of manufacturing the device.

US patent application no. 2005/0263853 describes a trench-gate IGBT having a carrier stored layer formed under a p type base region and having a doping or impurity concentration that is greater than the doping concentration of the n− type base semiconductor layer. Since the carrier stored layer is formed under the p type base region, the holes from the p+ anode layer are prevented from passing to the cathode electrode and the holes are stored in the carrier stored layer. This results in a reduction in the Vcesat voltage. However, the presence of the carrier stored layer increases the variation of the threshold voltage. This variation is detrimental to the control of the current distribution through the gate electrode over the die. This patent application also describes embodiments in which the doping concentration in the carrier stored layer is less in regions of the carrier stored layer adjacent the trenches compared to regions of the carrier stored layer other than adjacent the trenches so as to control the gate capacity and short circuit current and to prevent variations in threshold voltage. The different regions of the carrier stored layer having different doping concentrations is achieved by, for example, varying the thickness of the carrier stored layer, with the thinner regions having a lower doping concentration. The carrier stored layer is formed by selective implantation using a specific mask. The mask has to be autoaligned with the trenches in order to prevent a too highly doped channel region being formed. Thus, the method disclosed in this application requires additional critical manufacturing steps which add to the cost of manufacturing the device.

SUMMARY OF THE INVENTION

The present invention provides a method of forming a power semiconductor device and a power semiconductor device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings in which.

Elements in the figures are illustrated for simplicity and clarity and have not necessarily been drawn to scale.

DETAILED DESCRIPTION

In the description that follows and in FIGS. 1-8, certain regions are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions.

The present disclosure will be described with reference to a power semiconductor device comprising a planar N-channel Insulated Gate Rectifier (IGR) device. It will be appreciated that the disclosure is not limited to planar N-channel IGR devices and applies equally to other power semiconductor devices (e.g. those capable of supporting voltages greater than 600V), such as P-channel devices, trench-gate devices, IGBT devices, MOSFET devices, JFETs, diodes, other insulated gate semiconductor devices and/or similar devices.

Figure 1:
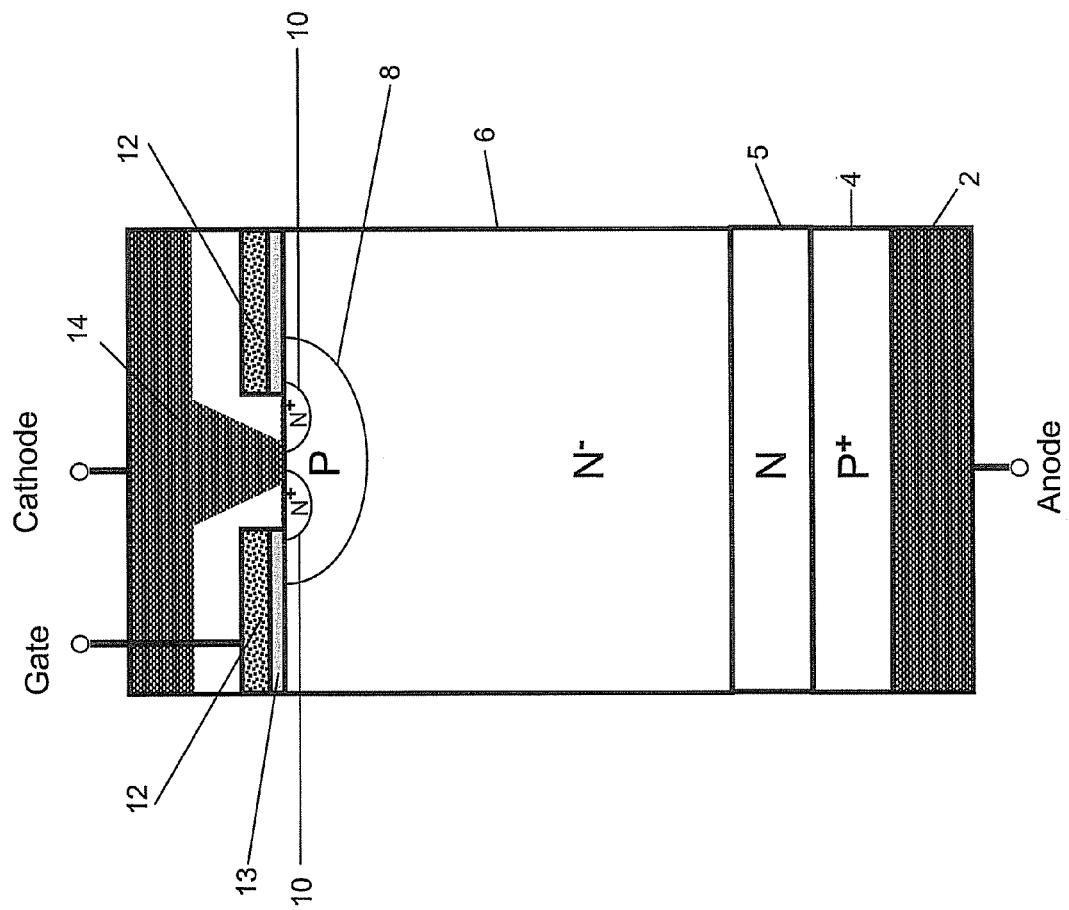
FIG. 1 is a schematic cross-section diagram of part of a cell of a typical IGBT device.
Figure 2:
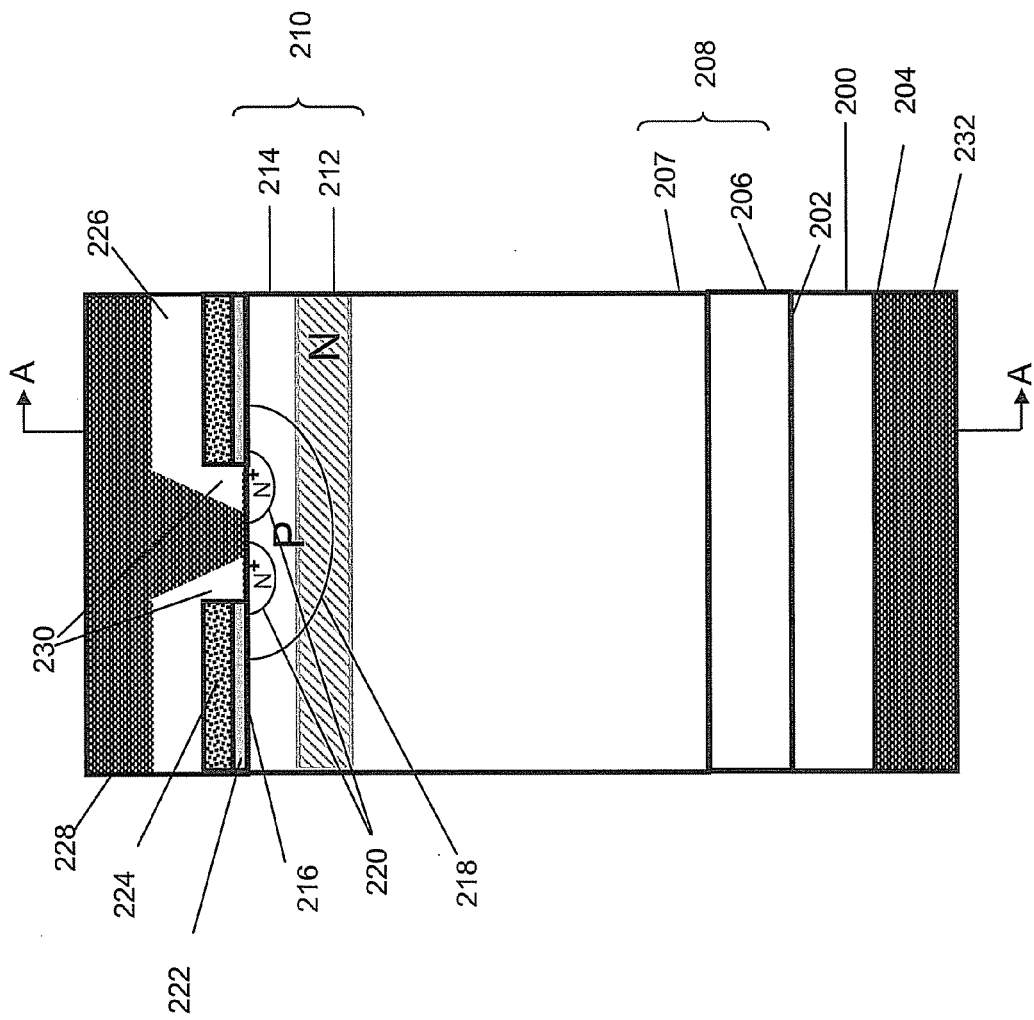
FIG. 2 is a schematic cross-section diagram of part of a power semiconductor device in accordance with an embodiment of the disclosure.

Referring now to FIG. 2, a power semiconductor device in accordance with an embodiment of the disclosure comprises a N-channel IGR device having an active area and a termination area which surrounds the active area. An IGR device typically comprises a plurality of base cells in the active area having semiconductor regions of a certain shape which defines the shape of the base cells. For example, the base cells may have any one of the following shapes: hexagonal, fingers, stripes or waves. FIG. 2 and subsequent FIGs show a simplified cross-sectional view of only a portion of a base cell for simplicity.

In an embodiment, the semiconductor device comprises a p+ type semiconductor substrate 200 having a first surface 202 and a second surface 204. The semiconductor substrate described herein can be any semiconductor material or combinations of materials, such as gallium nitride, silicon carbide, silicon-on-insulator (SOI), silicon, monocrystalline silicon, the like, and combinations of the above doped with p type dopant such as boron. The p+ semiconductor substrate 200 forms a current electrode layer of the semiconductor device which in the case of a IGR is the anode layer.

A n type semiconductor layer 208 is formed over the first surface 202 of the semiconductor substrate 200. In an embodiment, the semiconductor layer 208 comprises two epitaxial layers: a n epitaxial layer 206 and an n− epitaxial layer 207. Each layer typically includes epitaxially grown silicon and a n type dopant, such as arsenic or phosphorous. It will be appreciated however that epitaxially grown silicon or other semiconductor materials or semiconductor materials which are subsequently doped may be used instead. The n− epitaxial layer 207 has a thickness in the range of 50 microns and the n epitaxial layer 206 has a thickness in the range of 5 microns. The doping concentration of the n epitaxial layer 206 is greater than the doping concentration of the n− epitaxial layer 207, for example, by a factor of 100. When the IGR device is turned off, the n− epitaxial layer 207 provides a drift region of the IGR device between the anode and channel and hence requires a lower doping concentration in order to maximise the breakdown voltage capability of the device. Alternatively, semiconductor layer 208 may be a single n type epitaxial layer or may comprise a conventional prime substrate, such as a silicon substrate, doped with a n type dopant. In this latter case, anode layer 200 may not be a prime substrate and may be a layer formed on a bottom surface of the n type semiconductor substrate 208 for example by deposition.

A n type epitaxial layer 210 is formed over the semiconductor layer 208. The n type epitaxial layer 210 is a blanket layer in the sense it is formed over substantially all the semiconductor layer 208 and semiconductor substrate 200 and is doped with a n type dopant so as to have a doping concentration profile that increases from a first surface 216 of the epitaxial layer 210 towards the semiconductor layer 208. The epitaxial layer 210 can be considered as comprising a buried layer 212 formed over the semiconductor layer 208 and a semiconductor layer 214 formed over the buried layer 212. The doping concentration of the buried layer 212 is greater than the doping concentration of the semiconductor layer 214 by a factor of more than 5 and is also greater than the n− epitaxial layer 207. In an embodiment, the doping concentration of the buried layer 212 is greater than the doping concentration of the semiconductor layer 214 by a factor of 10. The buried layer 212 has a thickness in the range of 1-2 microns and the semiconductor layer 214 has a thickness in the range of 1 micron. Each of the buried layer 212 and the semiconductor layer 214 typically includes epitaxially grown silicon and a n type dopant, such as arsenic or phosphorous=. It will be appreciated however that epitaxially grown silicon or other semiconductor materials or semiconductor materials which are subsequently doped may be used instead. In an embodiment, the buried layer 212 and the semiconductor layer 214 are formed during the same epitaxial process with the concentration of n type dopant being varied in order to achieve the different doping concentrations of the layers 212 and 214. The epitaxial layer 210 may also be formed during the same epitaxial process used to form the semiconductor layer 208. In an embodiment, the n− epitaxial layer 207 has a doping concentration around 2E14 atoms per $cm^3$, the buried layer 212 has a doping concentration around 1E16 atoms per cm³ and the semiconductor layer 214 has a doping concentration around 1E15 atoms per cm³.

A p type base region 218 (referred to as the body region 218) extends from the first surface 216 of the epitaxial layer 210 (i.e. the first surface 216 of the semiconductor layer 214) through the semiconductor layer 214 and into the buried layer 212 typically to a depth of 1.8-2.0 microns. In order to avoid significantly reducing the breakdown voltage capability of the IGR device, the depth of the body region 218 and the depth of the buried layer 212 is typically arranged so that the buried layer 212 extends just below the body region 218 or at least extends to the same depth as the body region 218. If the buried layer 212 extends too far below the body region 218, the breakdown voltage capability of the device will be reduced whereas if the buried layer 212 does not extend far enough into the body region 218, the full benefit of reducing Vcesat is not achieved. Furthermore, the buried layer 212 has to be a certain distance from the emitter regions 220 so as not to significantly impact the threshold voltage which is a direct function of the net doping concentration just below the emitter regions 220. In other words, the location of the PN junction between the body region 218 and the epitaxial layer 210 is arranged to be located at or substantially adjacent to a region of the epitaxial layer 210 having a maximum doping concentration. N type regions 220 extend from the first surface 216 of the semiconductor layer 214 into the p type body region 218. The n type regions 220 provide current electrode regions of the semiconductor device. In the embodiment shown in FIG. 1, the n type regions 220 are the emitter regions 220 of the IGR device.

A gate region 224 which forms a gate electrode of the device is formed over the first surface 216 of the semiconductor layer 214 such that it extends over at least a portion of the body region 218, at least a portion of the semiconductor layer 214 and at least a portion of the emitter regions 220. The polysilicon region 224 is isolated from the semiconductor layer 214 by a layer such as a gate oxide layer 222 and typically comprises a doped polycrystalline semiconductor material such as polysilicon. A dielectric layer 226 is formed over the insulated gate region 224. The dielectric layer 226 may comprise a silicon oxide layer or may comprise several layers, such as oxide/nitride/oxide layers. In operation, by applying appropriate voltage signals to the insulated gate region 224, the IGR is turned on and a portion of the body region 218 under the insulated gate region 224 forms a channel region of the IGR enabling current to flow between the emitter regions 220, the drift region in the n− epitaxial layer 207 and the anode layer 200.

A metal or ohmic layer 228 is formed over the dielectric layer 226 and contacts the emitter regions 220 and the body region 218 to form the cathode electrode. A spacer 230 isolates the metal layer 228 from the insulated gate region 224.

A metal or ohmic layer 232 is formed over the second surface 204 of the semiconductor substrate 200 to form the anode electrode.

Figure 3:
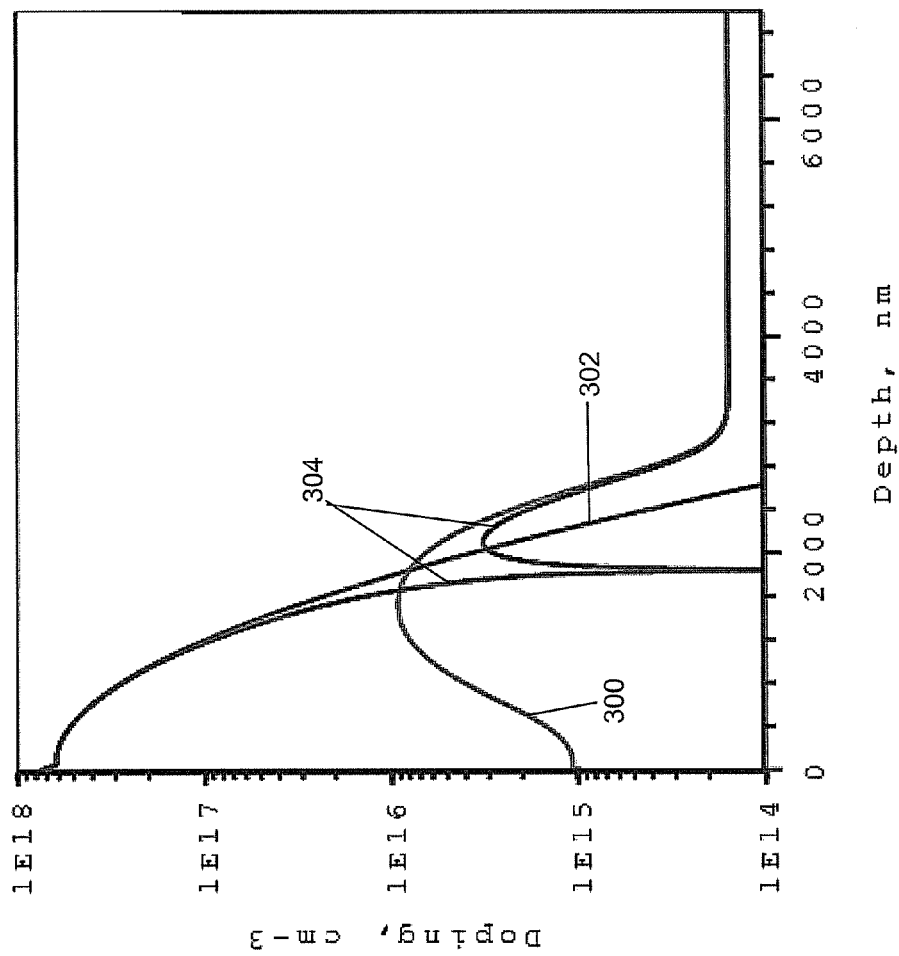
FIG. 3 is a graphical representation of the doping concentration profiles across the line A-A of FIG. 2.

FIG. 3 shows the doping concentration profile for the IGR device of FIG. 2 extending from the first surface 216 of the semiconductor layer 214 along the line A-A (as shown in FIG. 2). Curve 300 shows the n type doping concentration, curve 302 shows the p type doping concentration and curve 304 shows the net doping concentration.

Thus, as can be seen from FIG. 3, the n-type doping concentration increases from the first surface 216 across the epitaxial layer 210 to a maximum at the buried layer 212 which extends just below the p type body region 218 so that the doping concentration in the drift region of the n− epitaxial layer 207 is increased at or just adjacent (e.g. under) the PN junction between the body region 218 and the epitaxial layer 210. During device operation when the IGR device is turned on, electrons are injected from the cathode electrode into the buried layer 212. The increased n-type doping of the buried layer 212 provides a quasi-neutral condition which results in an increase in the number of holes that are stored in the buried layer 212 and introduced into the drift region of the n− epitaxial layer 207 under the body region 218 prior to being collected by the reverse PN junction (i.e. the PN junction between the body region 218 and the n− epitaxial layer 207). This results in a reduction of the saturated voltage across the anode and cathode (i.e. Vcesat) of the IGR device which improves device performance. The resulting hole carrier profile within the drift region of the n− epitaxial layer 207 when the IGR device is on is similar to the hole carrier profile of a PIN rectifier.

The reduced n type doping concentration provided by the semiconductor layer 214 at the first surface 216 compensates for the increased doping in the buried layer 212 which ensures that the threshold voltage of the IGR device is not impacted.

Another benefit of having a reduced n type doping concentration at the surface by means of the epitaxial semiconductor layer 214 is that the channel length is increased compared to the conventional arrangements which use surface implantation. This results in a reduction in the transconductance which is the ratio between the channel width (or perimeter) and channel length, and so a reduction in the Icsat (compared to conventional enhanced surface doping by implantation) since Icsat is directly proportional to the transconductance.

As the Icsat has been reduced further, via the transconductance, this in turn degrades the Vcesat. However, by applying the quasi-neutral condition to both types of carriers by having a highly doped buried layer 212, an increase in the number of holes (minority carriers) in regards to the doping profile concentration defined by the layer 212 (majority carriers) is provided. This compensates for the degradation of Vcesat due to the reduction in the transconductance and enables the Vcesat to be recovered.

FIG. 2 shows part of a base cell of an active area of the IGR device. The active area is surrounded by a termination area which extends from the active area to the edge of the device (i.e. the edge of the die). A role of the termination area is to provide protection structures which protect the PN junctions at the edge of the active area from, for example, the effects due to the junction curvature effect, when the device is in an off state. Without some form of protection, due to the junction curvature effect, the distribution of the potential lines is curved around the last PN junction and a peak electric field develops at the junction near the surface of the epitaxial layer which, when the peak electric field exceeds a critical electric field for the device, is high enough to cause impact ionization avalanche near the surface. This results in the breakdown voltage capability of the termination area being less than the active area. In order not to reduce the overall breakdown voltage capability of the device, there is therefore a desire to ensure that the breakdown voltage in the termination region is ideally substantially the same as the breakdown voltage in the active area.

Since the epitaxial layer 210 is formed over the semiconductor substrate 200, the epitaxial layer 210 extends across both the active area of the device and the termination area of the device. In order to ensure that the breakdown voltage capability in the termination area is not affected by the increased doping concentration of the buried layer 212, additional protection structures are required to be used in the termination area. These additional protection structures may include one or more of the following:

Guard rings in the surface of the epitaxial layer as disclosed in U.S. Pat. No. 5,032,878 with the guard rings furthest from the last PN junction in the active area being spaced further from each other compared to the guard rings closer to the last PN junction. Punch Through Retardation (PTR) technique disclosed in U.S. Pat. Nos. 5,032,878, 5,075,739, 5,777,373 in which an enhancement region of opposite conductivity type to that of the guard rings is formed between the guard rings to increase the punch-through voltage between the rings and thus, the breakdown voltage of the device.

Forming the protection structures having a shape according to the WellFET configuration as disclosed in PCT patent application no. WO 03/107432.

Buried floating termination regions as described in PCT patent application no. IB2007/000582.

More details of different termination structures can be found in PCT patent application no. IB2007/000582.

Figure 4:
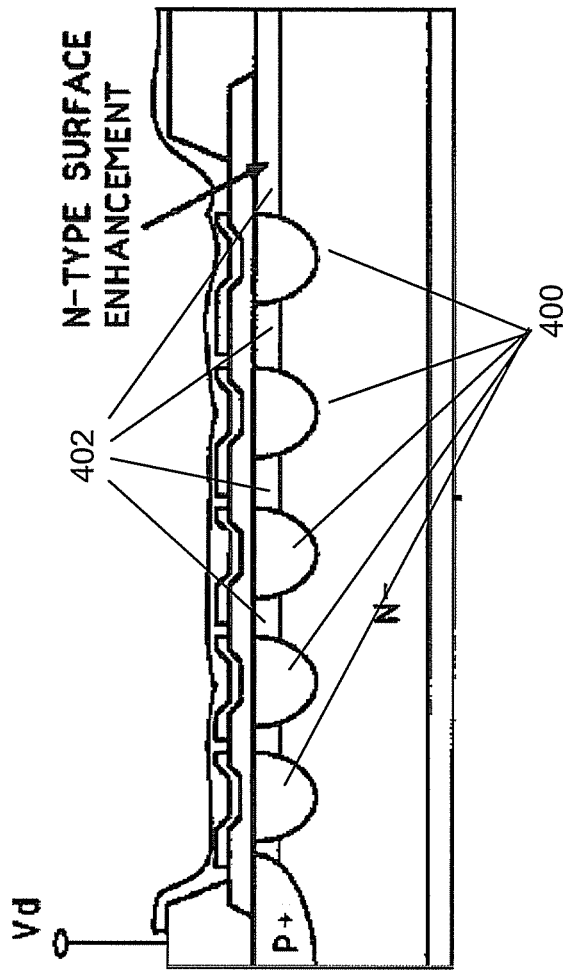
FIG. 4 is a schematic cross-section diagram of part of a termination area of a power semiconductor device.

FIG. 4 shows part of a termination area of a power semiconductor device with protection structures such as guard rings 400 and surface enhancement regions 402 which protection structures may be used in the termination area of a device having the blanket epitaxial layer 210 across substantially the whole of the device to compensate for the increased doping concentration provided by the buried layer 212. By using additional protection structures in the termination area, the breakdown voltage of the device can be well controlled.

A method of forming a power semiconductor device in accordance with an embodiment of the present disclosure will now be described with reference to FIGS. 5-7. Only part of the semiconductor device in the active area is shown for simplicity.

Figure 5:
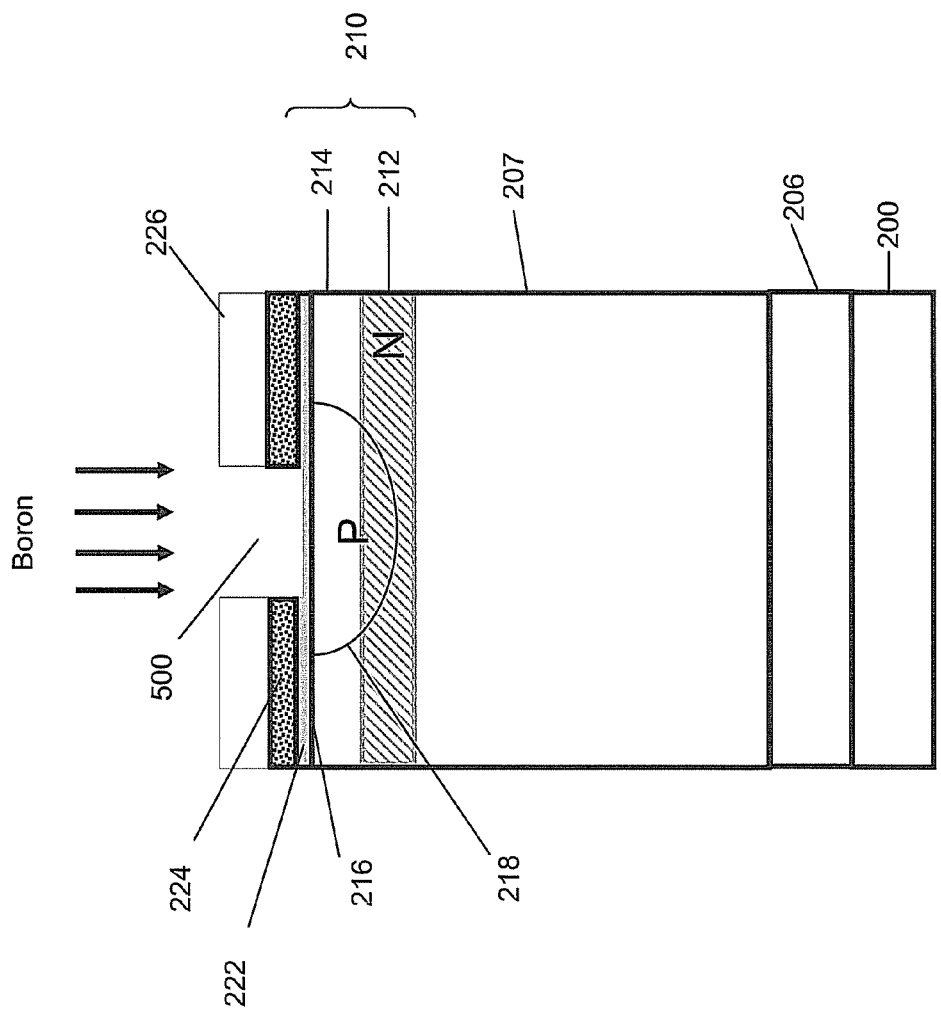
FIGS. 5-7 are schematic cross-section diagrams of the part of the semiconductor device of FIG. 2 during different stages of fabrication.

As shown in FIG. 5, the n epitaxial layer 206 is formed on the p+ semiconductor substrate 200 and then the n− epitaxial layer 207 is formed on the n epitaxial layer 206. Both layers may be formed by the same epitaxial deposition process, with the different doping concentrations of the different layers 206, 207 being obtained by varying the concentration of the n type dopant in the process.

The epitaxial layer 210 is then formed as a blanket layer across the semiconductor substrate 200 and the n− epitaxial layer 207 so as to provide the buried layer 212 formed on the n− epitaxial layer 207 and the semiconductor layer 214 formed on the buried layer 212 with the buried layer 212 having a higher (e.g. more than 5 times higher and in an embodiment, 10 time higher) doping concentration than the semiconductor layer 214. The epitaxial layer 210 may be formed in the same epitaxial apparatus as that used for forming the epitaxial layers 206 and 207. In this case, the epitaxial process used for forming the epitaxial layer 210 would be much slower (50 times slower) and at a lower temperature in order to achieve the higher doping concentration for the buried layer 212.

The anode layer 200 can be formed at any time. Thus, in an alternative embodiment, the method may start with a n type semiconductor substrate on which a n− epitaxial layer 207 or the epitaxial layer 210 is formed.

Protection structures such as guard rings and/or surface enhancement regions (not shown) are then formed in the termination area of the device. In an alternative embodiment, buried floating termination regions may be formed in the termination area of the device prior to growing the epitaxial layer 210.

The manufacturing of the power semiconductor device is then continued according to standard processes.

For example, a dielectric layer 222, such as a silicon oxide layer, is then formed over the device. This is the gate oxide layer 222. A polysilicon layer 224, or other type of conductive layer, is then formed over the gate oxide layer 222, for example, by deposition. A dielectric layer 226 is then deposited over the polysilicon layer 224. The dielectric layer 226 may comprise a silicon oxide layer or may comprise several layers, such as oxide/nitride/oxide layers.

The dielectric layer 226 and the polysilicon layer 224 are then etched to provide a body opening 500 through which the p type body region 218 may be formed in the epitaxial layer 210. The etched polysilicon layer 224 forms the insulated gate region 224 of the IGR device.

The p type body region 218 is then formed by implantation or diffusion of a p type material, such as boron (B11+), in the epitaxial layer 210 through the body opening 500. In an embodiment, a doping dose in the range of 5E13 cm$^{-2}$ is used. The wafer is then subjected to a high temperature, for example around 1080° C., to drive the p type body region 218 into the epitaxial layer 210 as shown in FIG. 5.

Figure 6:
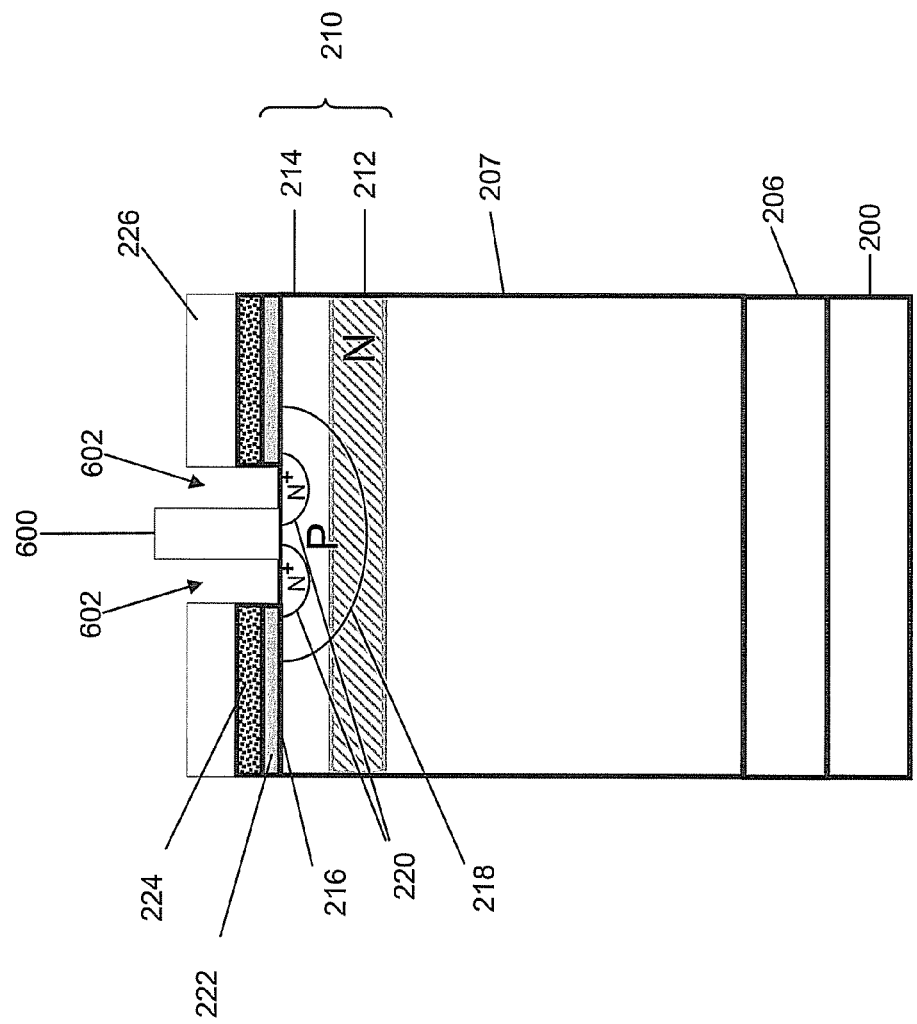

A mask 600 is formed over a portion of the dielectric layer 222 to mask off the body opening 500 and leave openings 602 as shown in FIG. 6. The emitter regions 220 are then formed by implantation of a n type material, such as arsenic or phosphorus, into the epitaxial layer 210 and the p body region 218.

Figure 7:
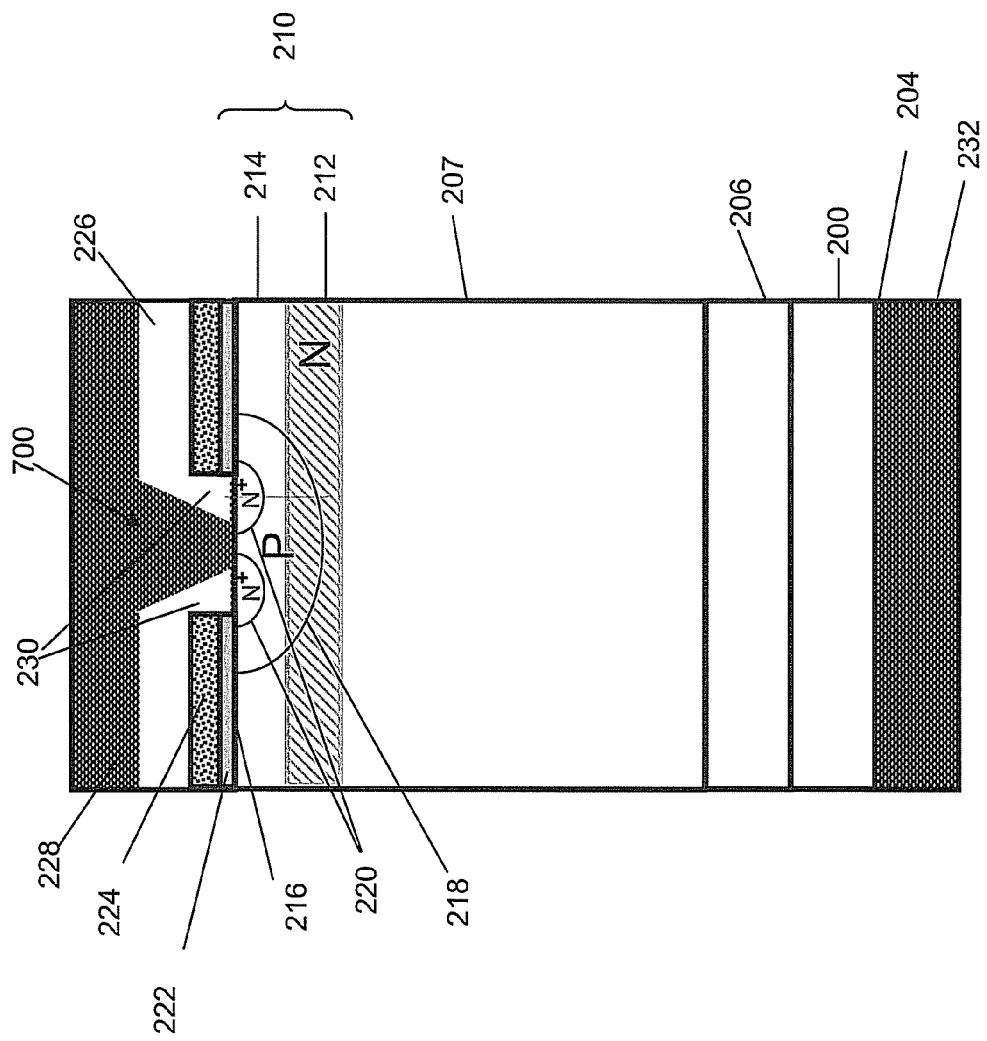

Referring now to FIG. 7, a dielectric layer (not shown), such as a TEOS layer, is formed over the dielectric layer 226 and the gate oxide layer 222. This dielectric layer (not shown) and the gate oxide layer 222 are then etched to provide a spacer 230 and opening 700. A heavily doped p+ layer (not shown) is formed by ion implantation between the emitter regions 220 in the body region 218. As is well known for IGBTs, this p+ region improves latchup immunity, and reduces the parasitic unwanted bipolar effects in the device.

The partly processed semiconductor device is then subjected to a low thermal operation and short drive so as to diffuse the emitter regions 220 into the epitaxial layer 210. For example, the semiconductor device is annealed up to a temperature of 900-950° C. for 30 minutes. Other process steps then take place including metallization wherein a metal layer 228 is formed on the dielectric layer 226 in contact with the emitter regions 220 and body region 218 so as to provide the cathode electrode, and a metal layer 232 is formed over the second surface 204 of the semiconductor substrate 200 to form the anode electrode, as shown in FIG. 2 and a metal layer (not shown) is formed over the dielectric layer 226 and contacts the insulated gate region 224 to form the gate electrode (not shown). The spacer 230 isolates the cathode from the insulated gate region 224.

The epitaxial layer 210 is formed by a blanket epitaxial process which is less expensive than the process steps needed for implanting n type layers which have to be aligned with the channel used in the known methods. By using a single wafer epitaxial reactor apparatus, the doping profile of the epitaxial layer 210 is easy to control and more flexible for engineering purposes than implantation methods. Having the flexibility to adjust the doping profile of the epitaxial layer 210 enables the Vcesat and Icsat trade-off to be more easily scaled.

Thus, the buried layer 212 of higher doping concentration can be formed easily using standard manufacturing process steps without the need for additional masks and implant steps. Thus, the method in accordance with the present disclosure achieves a reduction in Vcesat without significantly increasing the cost and complexity of device manufacture.

Figure 8:
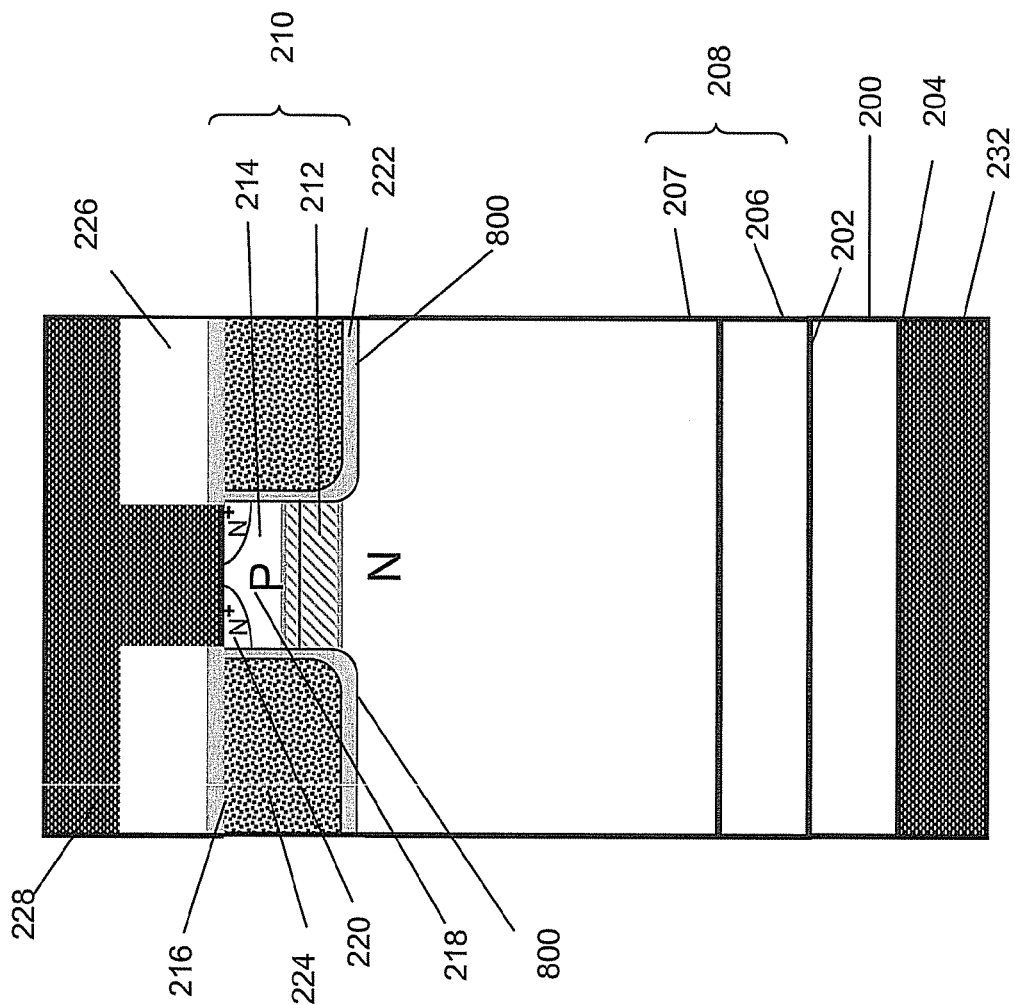
FIG. 8 is a schematic cross-section diagram of part of a trench gate power semiconductor device in accordance with another embodiment of the disclosure.

The epitaxial layer 210 can be used with planar and/or trench technologies and thus is compatible over a wide range of device configurations. FIG. 8 shows an example of how the epitaxial layer 210 may be used in a trench gate device. Like features to those of FIG. 2 are referenced by the same reference numeral.

With the trench gate device, an n semiconductor layer 208 is formed on a p+ semiconductor substrate and a n epitaxial layer 210 is formed over the semiconductor layer 208 as described above. The blanket epitaxial layer 210 has a doping profile that increases from a first surface 216 towards the semiconductor layer 208, for example as shown in FIG. 3. The doping profile will depend on the trench size and dimensions of the body region 218. A mask layer (not shown) is then formed over the epitaxial layer 210 and is then patterned and etched to provide a body opening (not shown). The p type body region 218 is then formed by implantation or diffusion of a p type material, such as boron (B11+), in the epitaxial layer 210 through the body opening. The wafer is then subjected to a high temperature, for example around 1080° C., to drive the p type body region 218 into the epitaxial layer 210. A mask (not shown) is formed in the body opening to mask off the body opening and leave openings (not shown) for the emitter regions 220. The emitter regions 220 are then formed by implantation of a n type material, such as arsenic or phosphorus, into the epitaxial layer 210 and the p body region 218.

Trenches 800 are then formed so as to pass through the emitter regions 220, the body regions 218 and the epitaxial layer 210. Then a gate oxide layer 222 is formed on an inner wall of the trenches 800 and a gate region 224 (which acts as the gate electrode) is buried in the trenches 800. The manufacture of the trench gate device is then continued according to standard processes.

The depth of the buried layer 212 is typically arranged so that the buried layer 212 extends just below the body region 218 or at least extends to the same depth as the body region 218 but is not as deep as the trenches 800. If the buried layer 212 extends too far below the body region 218, the breakdown voltage capability of the device will be reduced whereas if the buried layer 212 does not extend far enough into the body region 218, the full benefit of reducing Vcesat is not achieved. Furthermore, the buried layer 212 has to be a certain distance from the emitter regions 220 so as not to significantly impact the threshold voltage which is a direct function of the net doping concentration just below the emitter regions 220. In other words as in the planar arrangement described above, the location of the PN junction between the body region 218 and the epitaxial layer 210 is arranged to be located at or substantially adjacent to a region of the epitaxial layer 210 having a maximum doping concentration.

By applying a voltage to the gate electrode and so across the gate oxide layer 222, the device is turned on and a channel will be formed in the p type body regions 218, between the n+ emitter regions 220 and the semiconductor layer 208, adjacent the trench, connecting the n+ type emitter regions 220 and the p+ type anode layer 200 allowing a current to flow between the anode and the cathode electrodes.

In the foregoing specification, the invention has been described with reference to specific examples of embodiments of the invention. It will, however, be evident that various modifications and changes may be made therein without departing from the broader scope of the invention as set forth in the appended claims.

The invention claimed is:

1. A method of forming a power semiconductor device comprising:
    forming a first semiconductor layer of a first conductivity type extending across the power semiconductor device;
    forming an epitaxial layer of the first conductivity type over the first semiconductor layer, the epitaxial layer having a doping concentration that increases from a first surface of the epitaxial layer towards the first semiconductor layer to provide a first region adjacent to the first surface having a doping concentration lower than a second region adjacent to the first semiconductor layer;
    forming a body region of a second conductivity type in the epitaxial layer extending from the first surface of the epitaxial layer into the epitaxial layer, wherein a PN junction between the body region and the epitaxial layer extends through the first region and into the second region so that a maximum depth of the PN junction is at or just adjacent to a region of the epitaxial layer having a maximum doping concentration; and
    forming a gate region such that the gate region is adjacent at least a portion of the body region, wherein in operation of the semiconductor device the portion of the body region adjacent the gate region functions as a channel region of the semiconductor device.

2. The method according to claim 1, wherein forming an epitaxial layer comprises forming a blanket epitaxial layer extending across substantially all of the first semiconductor layer.

3. The method according to claim 1, wherein the first semiconductor layer is an epitaxial layer and wherein the steps of forming the first semiconductor layer and the epitaxial layer are performed in the same epitaxial apparatus.

4. The method according to claim 1, wherein the first semiconductor layer has a first doping concentration of the first conductivity type and wherein the doping concentration across the epitaxial layer is greater than the first doping concentration.

5. The method according to claim 1, wherein the step of forming the gate region comprises forming the gate region over the first surface of the epitaxial layer such that the gate region extends over at least a portion of the body region and at least a portion of the epitaxial layer.

6. The method according to claim 1, further comprising forming a current electrode region of the first conductivity type in the body region extending from the first surface into the body region.

7. The method according to claim 1, wherein forming a first semiconductor layer comprises forming the first semiconductor layer over a semiconductor substrate.

8. The method according to claim 7, wherein the semiconductor substrate is of the second conductivity type and has a first surface and a second surface wherein the first semiconductor layer is formed over the first surface of the semiconductor substrate and wherein the method further comprises forming a current electrode over the second surface of the semiconductor substrate.

9. The method according to claim 1, wherein the power semiconductor device comprises an active area and a termination area surrounding the active area, wherein the first semiconductor layer, and the epitaxial layer extend across the active area and termination area and wherein the body region and gate region are formed in the active area, the method further comprising forming at least one protection structure in the termination area to compensate for the doping concentration of the epitaxial layer.

10. The method according to claim 9, wherein the protection structure comprises at least one of:
    a termination region of the second conductivity type in the termination area, the at least one termination region extending from the first surface of the epitaxial layer into the epitaxial layer and
    a termination region of the first conductivity type in the epitaxial layer adjacent the first surface of the epitaxial layer.

11. A power semiconductor device comprising:
- a first semiconductor layer of a first conductivity type extending across the power semiconductor device;
- an epitaxial layer of the first conductivity type formed over the first semiconductor layer, the epitaxial layer having a doping concentration that increases from a first surface of the epitaxial layer towards the first semiconductor layer to provide a first region adjacent to the first surface having a doping concentration lower than a second region adjacent to the first semiconductor layer;
- a body region of a second conductivity type formed in the epitaxial layer extending from the first surface of the epitaxial layer into the epitaxial layer, wherein a PN junction between the body region and the epitaxial layer extends through the first region and into the second region so that a maximum depth of the PN junction is at or just adjacent to a region of the epitaxial layer having a maximum doping concentration; and
- a gate region adjacent at least a portion of the body region, wherein in operation of the semiconductor device the portion of the body region adjacent the gate region functions as a channel region of the semiconductor device.

12. The power semiconductor device according to claim 11, wherein the epitaxial layer is a blanket epitaxial layer extending across substantially all of the first semiconductor layer.

13. The power semiconductor device according to claim 11, wherein the first semiconductor layer has a first doping concentration of the first conductivity type and wherein the doping concentration across the epitaxial layer is greater than the first doping concentration.

14. The power semiconductor device according to claim 11, wherein the gate region is formed over the first surface of the epitaxial layer such that the gate region extends over at least a portion of the body region and at least a portion of the epitaxial layer.

15. The power semiconductor device according to claim 11, further comprising a current electrode region of the first conductivity type formed in the body region extending from the first surface into the body region.

16. The power semiconductor device according to claim 11, further comprising a semiconductor substrate, wherein the first semiconductor layer is formed over the semiconductor substrate.

17. The power semiconductor device according to claim 16, wherein the semiconductor substrate is of the second conductivity type and has a first surface and a second surface wherein the first semiconductor layer is formed over the first surface of the semiconductor substrate and the semiconductor device further comprises a current electrode formed over the second surface of the semiconductor substrate.

18. The power semiconductor device according to claim 11, wherein the power semiconductor device comprises an active area and a termination area surrounding the active area, wherein the first semiconductor layer, and the epitaxial layer extend across the active area and termination area and wherein the body region and gate region are formed in the active area, the semiconductor device further comprising at least one protection structure formed in the termination area to compensate for the doping concentration of the epitaxial layer.

19. The power semiconductor device according to claim 18, wherein the protection structure comprises at least one of:
- a termination region of the second conductivity type in the termination area, the at least one termination region extending from the first surface of the epitaxial layer into the epitaxial layer; and
- a termination region of the first conductivity type in the epitaxial layer adjacent the first surface of the epitaxial layer.

20. The method according to claim 1 wherein the first region and the second region of the epitaxial layer are formed during one epitaxial process, and wherein a concentration of a dopant of the first type is varied during the epitaxial process.

* * * * *